United States Patent
Chou

(10) Patent No.: US 12,217,988 B2
(45) Date of Patent: Feb. 4, 2025

(54) METHOD AND DEVICE FOR DETECTING PLACEMENT OF WAFERS IN WAFER CASSETTE

(71) Applicant: HON HAI PRECISION INDUSTRY CO., LTD., New Taipei (TW)

(72) Inventor: Yu-Ting Chou, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 417 days.

(21) Appl. No.: 17/569,642

(22) Filed: Jan. 6, 2022

(65) Prior Publication Data
US 2022/0216081 A1 Jul. 7, 2022

(30) Foreign Application Priority Data
Jan. 7, 2021 (CN) .......................... 202110020067.1

(51) Int. Cl.
| | |
|---|---|
| *H01L 23/02* | (2006.01) |
| *G01N 21/95* | (2006.01) |
| *G06T 7/00* | (2017.01) |
| *G06T 7/73* | (2017.01) |
| *H01L 21/67* | (2006.01) |

(52) U.S. Cl.
CPC ... *H01L 21/67265* (2013.01); *G01N 21/9501* (2013.01); *G06T 7/001* (2013.01); *G06T 7/74* (2017.01); *G06T 2207/20081* (2013.01); *G06T 2207/30148* (2013.01); *H01L 23/02* (2013.01); *H01L 2225/06596* (2013.01)

(58) Field of Classification Search
CPC ......... H01L 21/67259; H01L 21/67265; H01L 23/02; H01L 2225/06596; G01N 21/9501; G06T 7/73; G06T 7/74; G06T 7/001; G06T 2207/20081; G06T 2207/20084; G06T 2207/30148
See application file for complete search history.

(56) References Cited

U.S. PATENT DOCUMENTS

| | | | |
|---|---|---|---|
| 2010/0074514 A1* | 3/2010 | Hayashi | G06T 7/001 382/145 |
| 2022/0359154 A1* | 11/2022 | Chou | H01J 37/28 |

FOREIGN PATENT DOCUMENTS

| | | | |
|---|---|---|---|
| CN | 201327824 Y | * | 10/2009 |
| CN | 110739253 A | * | 1/2020 |
| CN | 110931409 A |  | 3/2020 |
| JP | 2006108144 A | * | 4/2006 |
| JP | 2013157395 A | * | 8/2013 |
| KR | 20200115418 A | * | 7/2021 |
| TW | 606479 U | * | 1/2021 |

* cited by examiner

*Primary Examiner* — Gandhi Thirugnanam
*Assistant Examiner* — Michael Adam Shariff
(74) *Attorney, Agent, or Firm* — ScienBiziP, P.C.

(57) ABSTRACT

A method and a device for detecting a placement of wafers in a wafer cassette are provided. The wafer cassette includes a plurality of receiving grooves. The receiving grooves hold and store the wafers. Light is emitted through the wafer cassette. The light passes through the gaps and is imaged, and the image is captured. Characteristic information is extracted from the image. The extracted characteristic information is compared with standard characteristic information of a preset image, and whether a placement of all the wafers in the wafer cassette is qualified and satisfactory is determined according to a compared result.

12 Claims, 4 Drawing Sheets

METHOD AND DEVICE FOR DETECTING PLACEMENT OF WAFERS IN WAFER CASSETTE

FIELD

The subject matter relates to detecting placement of wafers, and more particularly, to a method and a device for detecting placement of wafers in a wafer cassette.

BACKGROUND

After manufacturing, wafers are placed in different grooves of a wafer cassette by a robot arm. Then, top cover of the wafer cassette is closed, and a worker needs to check whether the quantity and the positions of the wafers in the wafer cassette are correct. Fragments dropped from the wafers, and errors such as more than two wafers being placed together in a single groove of the wafer cassette need to be manually detected.

However, the manual detection method may be low in efficiency and accuracy. When the wafer cassette and the cover have a poor transparency, light intensity of the ambient environment needs to be increased to clearly show the placement of the wafers in the wafer cassette. However, damages may cause to eyes of the workers when working under high intensity light. Furthermore, the wafers cannot be seen if the wafer cassette and the cover are opaque.

BRIEF DESCRIPTION OF THE DRAWINGS

Implementations of the present technology will now be described, by way of example only, with reference to the attached figures.

DETAILED DESCRIPTION

Figure 1:
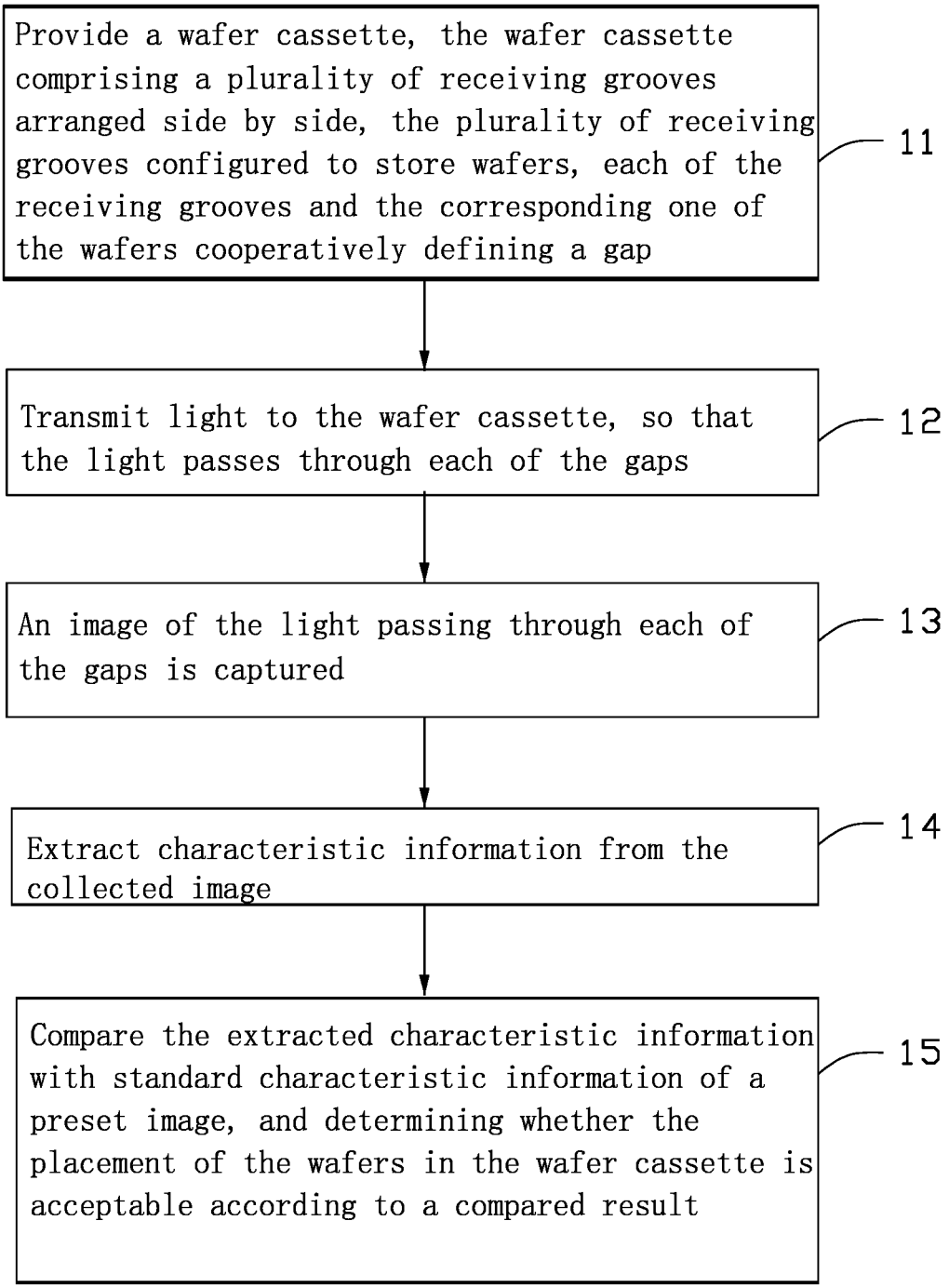
FIG. 1 is a flowchart of an embodiment of a method for detecting placement of wafers in a wafer cassette according to the present disclosure.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant characteristic being described. Also, the description is not to be considered as limiting the scope of the embodiments described herein. The drawings are not necessarily to scale, and the proportions of certain parts may be exaggerated to better illustrate details and characteristics of the present disclosure.

The term "comprising," when utilized, means "including, but not necessarily limited to"; it specifically indicates open-ended inclusion or membership in the so-described combination, group, series, and the like.

FIG. 1 illustrates an embodiment of a method for detecting a placement of wafers 2 in a wafer cassette 1. The method is provided by way of embodiment, as there are a variety of ways to carry out the method. The method can begin at block 11.

At block 11, the wafer cassette 1 is provided.

Figure 2:
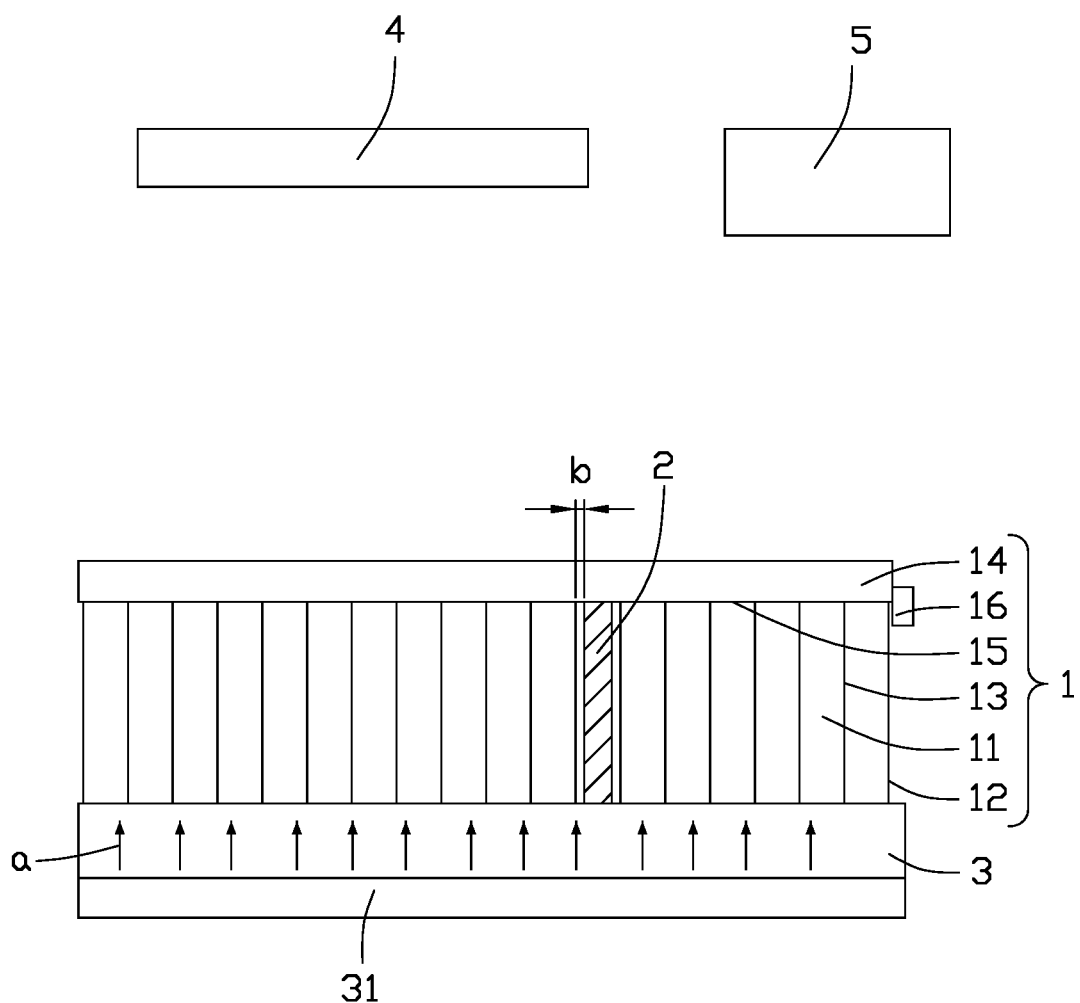
FIG. 2 is a block diagram of an embodiment of a device for detecting placement of wafers in a wafer cassette according to the present disclosure.
Figure 3:
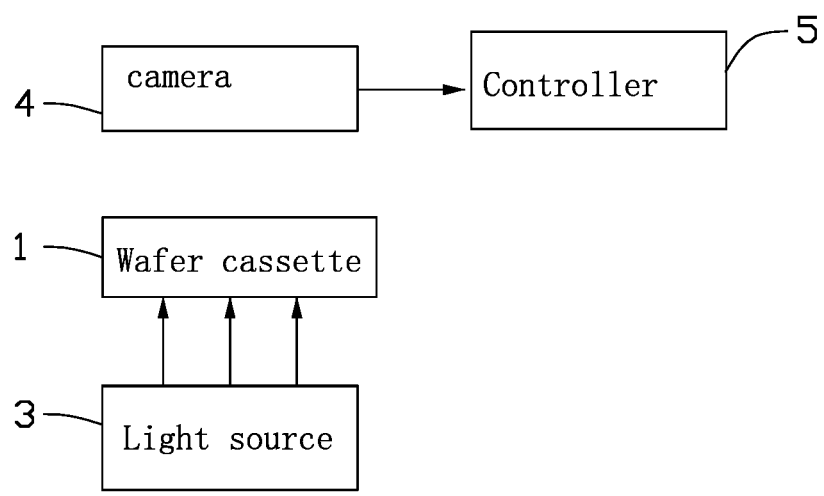
FIG. 3 is a diagrammatic view of the device of FIG. 2.

Referring to FIGS. 2 and 3, the wafer cassette 1 includes a plurality of receiving grooves 11 arranged side by side. Each receiving grooves 11 is used to store one wafer 2. The wafer cassette 1 further includes a housing 12, a plurality of diaphragms 13 disposed in the housing 12, and a cover 14 connected to the housing 12. Adjacent diaphragms 13 are parallel with each other and cooperatively form a receiving groove 11. One end of each receiving groove 11 close to the cover 14 defines an opening 15. Each wafer 2 is placed in a receiving groove 11 through the corresponding opening 15.

In an embodiment, one side of the cover 14 is rotatably connected to the housing 12. The cover 14 and the housing 12 are locked together through a locking unit 16, such as buckle.

Figure 4:
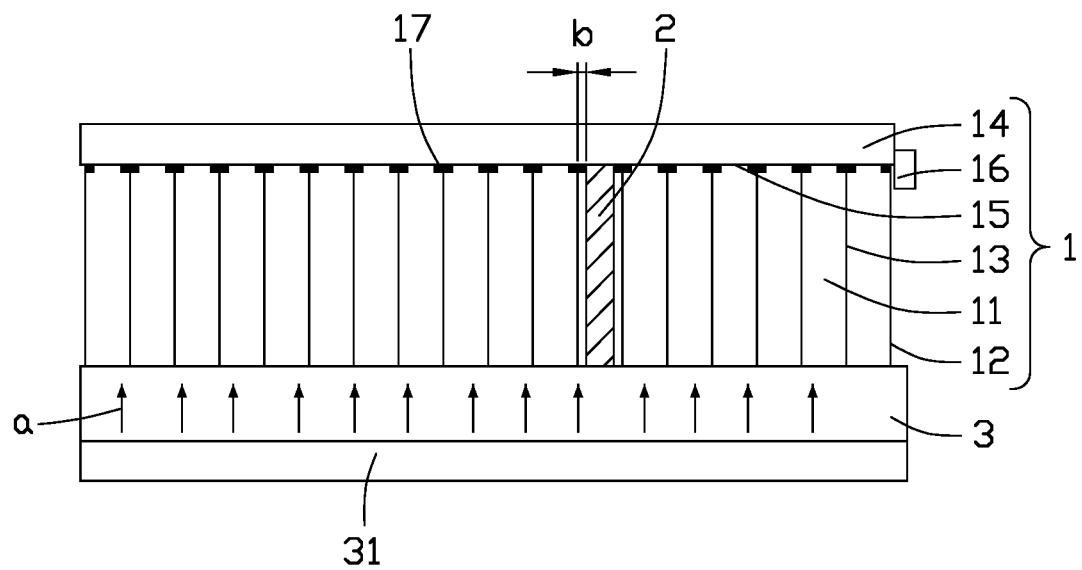
FIG. 4 is a diagrammatic view of another embodiment of the device according to the present disclosure.

In an embodiment, referring to FIG. 4, the wafer cassette 1 further includes a plurality of tenons 17 disposed on an inner side of the cover 14. Each tenon 17 corresponds to one diaphragm 13. A distance between adjacent tenons 17 is approximately equals to a thickness of the wafer 2. The wafer 2 is clamped between adjacent tenons 17. The adjacent tenons 17 fix the wafer 2 in the receiving groove 11 to avoid movement of the wafer 2.

In an embodiment, the cover 14 is connected to a top end of the housing 12. The opening 15 faces upwards, which is convenient for placing the wafer 2 in the corresponding receiving groove 11. Furthermore, any separation of the wafer 2 from the receiving groove 11 is avoided when moving the wafer cassette 1.

In an embodiment, each receiving groove 11 receives one wafer 2, which can avoid damage to the wafer 2 caused by stacking the wafers 2 and facilitate a subsequent detection of the wafer 2. The method of the present disclosure determines whether more than one wafers 2 is stacked in one receiving groove 11. When the wafer 2 is placed in the receiving groove, the two diaphragms 13 of such receiving groove 11 and the wafer 2 cooperatively define a gap "b". Light can pass through the gap "b".

In an embodiment, the housing 12 may be transparent, translucent, or opaque. The cover 14 may be transparent, translucent, or opaque. When the housing 12 and the cover 14 are opaque, the light with a special wavelength (such as infrared light) can be used to irradiate the wafer cassette 1 and the cover 14, so that the light passing through the gap "b" can be projected into an image of the placement of wafers 2 and the receiving grooves 11 in the wafer 2.

The housing 12 may be made of, but is not limited to, plastic, or glass. The cover 14 may be made of, but is not limited to, plastic, or glass. In an embodiment, the housing 12 and the cover 14 are made of plastic. The tenon 17 may be made of, but is not limited to, plastic, or other elastic materials. The tenon 17 is deformable.

At block 12, the light defined as "a" is transmitted to the wafer cassette 1, so that the light "a" passes through the gaps "b" between each of the receiving grooves 11 and the corresponding wafer 2.

In an embodiment, a light source 3 is used to transmit the light "a". The light source 3 is disposed at a bottom of the wafer cassette 1. The wafers 2 are disposed perpendicular to the light source 3. The light "a" transmitted by the light source 3 is roughly parallel to a surface of the wafer 2. The wafer cassette 1 is placed at a suitable position relative to the light source 3. When the light source 3 transmits the light "a", a portion of the light "a" reaches and is reflected by the wafers 2. Other portion of the light "a" pass through the gaps "b", so that the image of the wafers 2 and the receiving grooves 11 can be obtained. At the same time, definition and clarity of the image can be adjusted by adjusting the intensity and the color temperature of the light source 3.

In an embodiment, the light source 3 may be, but is not limited to, LED light strips. A plurality of LED light strips is evenly disposed on the bottom of the wafer cassette 1, which can illuminate a whole wafer cassette 1 and avoid dark areas.

Block 13, an image of the light "a" passing through each of the gaps is captured.

In an embodiment, the light "a" passing through the gaps "b" is projected into an image by a camera unit 4. The camera unit 4 is disposed on a side of the wafer cassette 1 away from the light source 3 to capture the image of the light "a".

The camera unit 4 includes at least one camera. The camera is disposed along a transmission direction of the light "a" to capture the light "a" and project the light "a" into the image of the wafer cassette 1 with the wafers 2. In an embodiment, in order to obtain images at different angles of the wafer cassette 1, a plurality of cameras may be disposed on different positions above the wafer cassette 1. The images of the receiving grooves 11 and of the wafers 2 in the wafer cassette 1 can be obtained at the same time.

The camera may be, but is not limited to, a general optical camera, or a CCD camera.

In an embodiment, the camera is a CCD camera. By setting a plurality of CCD cameras at different positions above the wafer cassette 1, images of different angles of the wafer cassette 1 with the receiving grooves 11 and the wafers 2 can be captured. The clear images allow subsequent characteristic extraction, characteristic comparison, and determinations.

Block 14, characteristic information is extracted from the image.

In an embodiment, the characteristic information is extracted through a controller 5. The controller 5 is connected to the camera unit 4 to receive the image.

In an embodiment, the characteristic information of the image includes the quantity of the wafers 2 in each receiving groove 11. The quantity of the wafers 2 in each receiving groove 11 can be determined from the image of the wafer cassette 1, since the image includes the receiving grooves 11, the tenons 17, and the wafer(s) 2 in each receiving groove 11. The quantity of the wafers 2 in each receiving groove 11 can be determined by calculating a total width of the wafer(s) 2 between adjacent tenons 17 of each receiving groove 11.

Block 15, the extracted characteristic information is compared with standard characteristic information of a preset image, and whether the placement of the wafers 2 in the wafer cassette 1 is acceptable and satisfactory is determined according to a compared result.

In an embodiment, the above determinative process is also executed through the controller 5.

When the image does not include any wafer 2 in a receiving groove 11, the controller 5 determines that there is no wafer 2 between two adjacent tenons 17 corresponding to one receiving groove 11. At this time, the wafer 2 in the receiving groove 11 is missing or damaged. When the total width of the wafer(s) 2 in a corresponding receiving groove 11 of the image is larger than a standard width of the preset image, the controller 5 determines that more than one wafer 2 are stacked in a single receiving groove 11. The placement of at least two wafers 2 in a single receiving groove 11 also presses against the tenons 17, causing the tenons 17 to over-deform. When the tenons 17 are shown to be deformed in the image, it can be determined that at least two wafers 2 are in one single receiving groove 11. When only one wafer 2 is disposed between two adjacent tenons 17 corresponding to each receiving groove 11, the controller 5 determines that the placement of the wafers 2 in the wafer cassette 1 is qualified and satisfactory.

Therefore, through the determinative process of the above characteristic information, whether the placement of the wafer 2 in the wafer cassette 1 is qualified or not can be determined.

In an embodiment, the preset image is obtained by computer vision model training or artificial intelligence (AI) deep learning model training, including the following steps.

Firstly, a large number of standard images of the wafers 2 in the wafer cassette 1 are captured. Characteristic information is extracted from each standard image. Then, the wafer cassette 1 to be detected is detected under a constant environment. In an embodiment, the extracted characteristic information of the detection wafer cassette 1 is compared with the standard characteristic information of the preset image by the controller 5. The placement of the wafers 2 in the wafer cassette 1 is determined to be acceptable when each characteristic information of the detection wafer cassette 1 conforms to the standard characteristic information of the preset image. The controller 5 will also automatically put a marking on the image of the detection wafer cassette 1, if the characteristic information does not conform to the standard characteristic information of the preset image. Then, the placement of the wafers 2 in the wafer cassette 1 can be improved according to the marking. If the wafers 2 are stacked in a single receiving groove 11 or if the wafer 2 in the receiving groove 11 is damaged, the out-of-place wafer 2 can be removed. If a receiving groove 11 is unoccupied, a wafer 2 can be added in that receiving groove 11.

The method of the present disclosure is high in efficiency and accuracy, which can also avoid damage to eyes of the workers. The method can detect the placement of the wafers 2 in an opaque wafer cassette 1 with an opaque cover 14. Through the above method, positions whose characteristic information does not conform to the standard characteristic information of the preset image can be accurately achieved, which not only improves the detection efficiency, but also improves the product yield.

FIGS. 2 and 3 illustrate a device 100 for detecting the placement of the wafers 2 in the wafer cassette 1. The wafer cassette 1 includes a light source 3, a camera unit 4 disposed on a light emitting side of the light source 3, and a controller 5 connected to the camera unit 4.

In use, the wafer cassette 1 is disposed between the light source 3 and the camera unit 4. The light source 3 transmits the light "a" to the wafer cassette 1, so that the light "a" can pass through the gap "b" between the adjacent diaphragm 13 and the wafer 2.

In an embodiment, the device 100 includes a plurality of light sources 3. By setting the light sources 31 at positions corresponding to the receiving grooves 11, the lights "a" transmitted by all the light sources 31 illuminates the receiving grooves 11, so that all the receiving grooves 11 and the wafers 2 in the wafer cassette 1 can be examined and imaged.

The camera unit 4 is used to project the light "a" passing through the gaps "b" into the image.

The camera unit 4 includes at least one camera. The image of the wafer cassette 1 can be obtained by setting the camera along the transmission direction of the light "a".

The camera unit 4 may also include at least two cameras. By setting the cameras at different positions of the wafer cassette 1, images of the receiving groove 11 and the wafers 2 can be captured from different angle.

The controller 5 is used to extract characteristic information from the image, compare the extracted characteristic information with a standard characteristic information of a preset image, and determine whether a placement of all the wafers 2 in the wafer cassette 1 is in order and acceptable according to a compared result.

In an embodiment, the characteristic information includes the quantity of the wafers 2 in each receiving groove 11.

The controller 5 is further used to display the images and the result of determination.

The device 100 in the present disclosure can be used to detect the placement of the wafers 2 in an opaque wafer cassette 1 with wafers 2. Through the above device 100, positions whose characteristic information does not conform to the standard characteristic information of the preset image can be accurately obtained, which not only improves the detection efficiency, but also improves the product yield. The device 100 also has a simple structure, which is portable, flexible, and convenient.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including, the full extent established by the broad general meaning of the terms used in the claims.

What is claimed is:

1. A method of detecting placement of a plurality of wafers in a wafer cassette, comprising:

providing a wafer cassette containing wafers, the wafer cassette comprising a plurality of receiving grooves arranged side by side, each of the plurality of receiving grooves configured to store one of the plurality of wafers, each of the plurality of receiving grooves and the corresponding one of the wafers cooperatively defining a gap, wherein the wafer cassette further comprises a housing and a cover connected to the housing, a plurality of diaphragms disposed in the housing, adjacent two of the plurality of diaphragms are arranged parallel with each other and cooperatively form the corresponding one of the plurality of receiving grooves, one end of each of the plurality of receiving grooves close to the cover defines an opening, each of the plurality of receiving grooves are configured to receive the plurality of wafers through the corresponding opening, the wafer cassette further comprises a plurality of tenons disposed on an inner side of the cover, each of the plurality of tenons corresponds to the corresponding one of the plurality of diaphragms, a distance between adjacent two of the plurality of tenons is equal to a thickness of each of the plurality of wafers, adjacent two of the plurality of tenons are configured to clamp one of the plurality of wafers, each of the plurality of tenons is made of elastic material;

transmitting light to the wafer cassette by a light source, so that the light passes through each of the gaps;

capturing an image of the light passing through each of the gaps by a camera unit;

extracting characteristic information from the image by a controller, the extracted characteristic information comprising a width between adjacent two of the plurality of tenons and an image of each of the plurality of the tenons; and comparing the extracted characteristic information with standard characteristic information of a preset image by the controller, the standard characteristic information of the preset image comprising a width between adjacent two of the plurality of tenons clamping one wafer and an image of each of the plurality of the tenons which is undeformed, when each of the extracted characteristic information is consistent with a corresponding standard characteristic information, determining the placement of the plurality of wafers in the wafer cassette is acceptable by the controller, and when at least one of the extracted characteristic information is inconsistent with the corresponding standard characteristic information, determining the placement of the plurality of wafers in the wafer cassette is unacceptable and then marking on the image by the controller.

2. The method of claim 1, wherein the cover is rotatably connected to the housing.

3. The method of claim 2, wherein the cover and the housing are locked together through a locking unit.

4. The method of claim 1, wherein the wafer cassette is transparent, translucent, or opaque.

5. The method of claim 1, the method further comprising acquiring the preset image by computer vision model training or artificial intelligence (AI) deep learning model training.

6. A device configured for detecting placement of a plurality of wafers in a wafer cassette, comprising:

a wafer cassette comprising a plurality of receiving grooves arranged side by side, the plurality of receiving grooves being configured to store the plurality of wafers, each of the plurality of receiving grooves and the corresponding one of the plurality of wafers cooperatively defining a gap, wherein the wafer cassette further comprises a housing and a cover connected to the housing, a plurality of diaphragms disposed in the housing, adjacent two of the plurality of diaphragms are arranged parallel with each other and cooperatively form the corresponding one of the plurality of receiving grooves, one end of each of the plurality of receiving grooves close to the cover defines an opening, each of the plurality of receiving grooves are configured to receive the plurality of wafers through the corresponding opening, and the wafer cassette further comprises a plurality of tenons disposed on an inner side of the cover, each of the plurality of tenons corresponds to the corresponding one of the plurality of diaphragms, a distance between adjacent two of the plurality of tenons is equal to a thickness of each of the plurality of wafers, adjacent two of the plurality of tenons are configured to clamp one of the plurality of wafers, each of the plurality of tenons is made of elastic material;

a light source configured to transmit light to the wafer cassette, so that the light passes through each of the gaps;

a camera unit configured to capture an image of the light passing through each of the gaps;

a controller configured to extract characteristic information from the image, the extracted characteristic information comprising a width between adjacent two of the plurality of tenons and an image of each of the plurality of the tenons, the controller further configured to compare the extracted characteristic information with standard characteristic information of a preset image, the standard characteristic information of the preset image comprising a width between adjacent two of the plurality of tenons clamping one wafer and an image of each of the plurality of the tenons which is undeformed, when each of the extracted characteristic information is consistent with a corresponding standard characteristic information, the controller further configured to determine the placement of the plurality of wafers in the wafer cassette is acceptable, and when at least one of the extracted characteristic information is inconsistent with the corresponding standard characteristic information, the controller further configured to determine the placement of the plurality of wafers in the wafer cassette is unacceptable and mark on the image.

7. The device of claim 6, wherein the cover is rotatably connected to the housing.

8. The device of claim 7, wherein the cover and the housing are locked together through a locking unit.

9. The device of claim 6, wherein the wafer cassette is transparent, translucent, or opaque.

10. The device of claim 6, wherein the preset image is obtained by computer vision model training or artificial intelligence (AI) deep learning model training.

11. The device of claim 6, wherein the camera unit comprises a plurality of cameras, the plurality of cameras is disposed on a side of the wafer cassette close the cover.

12. The device of claim 6, wherein the light source comprises at least one light emitting diode (LED) light, the at least one LED light is disposed on a side of the wafer cassette away from the cover.

* * * * *